(12) United States Patent
Farooq et al.

(10) Patent No.: US 8,679,971 B2
(45) Date of Patent: Mar. 25, 2014

(54) METAL-CONTAMINATION-FREE THROUGH-SUBSTRATE VIA STRUCTURE

(71) Applicant: International Business Machines Corporation, Armonk, NY (US)

(72) Inventors: Mukta G. Farooq, Hopewell Junction, NY (US); Robert Hannon, Wappingers Falls, NY (US); Richard P. Volant, New Fairfield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/756,981

(22) Filed: Feb. 1, 2013

(65) Prior Publication Data

US 2013/0143400 A1    Jun. 6, 2013

Related U.S. Application Data

(62) Division of application No. 12/840,688, filed on Jul. 21, 2010, now Pat. No. 8,492,878.

(51) Int. Cl.
*H01L 21/44* (2006.01)

(52) U.S. Cl.
USPC ............... 438/653; 438/627; 438/643

(58) Field of Classification Search
USPC .................................... 438/113, 653
See application file for complete search history.

(56) References Cited

U.S. PATENT DOCUMENTS

| | | | |
|---|---|---|---|
| 6,448,174 B1 * | 9/2002 | Ramm | 438/637 |
| 6,555,461 B1 | 4/2003 | Woo et al. | |
| 6,838,772 B2 | 1/2005 | Saitoh et al. | |
| 7,154,178 B2 | 12/2006 | Lin | |
| 2002/0011415 A1 * | 1/2002 | Hey et al. | 205/104 |
| 2008/0057699 A1 | 3/2008 | Jeon | |
| 2008/0142990 A1 * | 6/2008 | Yu et al. | 257/777 |
| 2008/0157367 A1 | 7/2008 | Kim et al. | |
| 2008/0174021 A1 | 7/2008 | Choi et al. | |
| 2009/0134497 A1 * | 5/2009 | Barth et al. | 257/621 |
| 2009/0152602 A1 * | 6/2009 | Akiyama | 257/288 |
| 2009/0321938 A1 | 12/2009 | Cunningham | |

\* cited by examiner

*Primary Examiner* — Ajay K Arora
(74) *Attorney, Agent, or Firm* — Scully, Scott, Murphy & Presser, P.C.; Katherine S. Brown, Esq.

(57) ABSTRACT

A through-substrate via (TSV) structure that is immune to metal contamination due to a backside planarization process is provided. After forming a through-substrate via (TSV) trench, a diffusion barrier liner is conformally deposited on the sidewalls of the TSV trench. A dielectric liner is formed by depositing a dielectric material on vertical portions of the diffusion barrier liner. A metallic conductive via structure is formed by subsequently filling the TSV trench. Horizontal portions of the diffusion barrier liner are removed. The diffusion barrier liner protects the semiconductor material of the substrate during the backside planarization by blocking residual metallic material originating from the metallic conductive via structure from entering into the semiconductor material of the substrate, thereby protecting the semiconductor devices within the substrate from metallic contamination.

20 Claims, 17 Drawing Sheets

METAL-CONTAMINATION-FREE THROUGH-SUBSTRATE VIA STRUCTURE

CROSS REFERENCE TO RELATED APPLICATION

This application is a divisional of U.S. patent application Ser. No. 12/840,688, filed Jul. 21, 2010, the entire content and disclosure of which is incorporated herein by reference.

BACKGROUND

The present disclosure relates to the field of semiconductor structures, and particularly to metal-contamination-free through-substrate via structures and methods of manufacturing the same.

In recent years, "three dimensional silicon" (3DSi) structures have been proposed to enable joining of multiple silicon chips and/or wafers that are mounted on a package or a system board. The 3DSi structures employ conductive via structures, which are referred to as "through-substrate via" structures or "TSV" structures, which provide electrical connection through the substrate of a semiconductor chip. The TSV structures increase the density of active circuits that are integrated in a given space. Such 3DSi structures employ through-substrate vias (TSVs) to provide electrical connection among the multiple silicon chips and/or wafers.

A conventional TSV structure typically employs a copper via structure that extends through the substrate of a semiconductor chip. The copper via structure is laterally electrically isolated from the substrate by a silicon oxide dielectric liner. The silicon oxide dielectric liner does not prevent metallic materials from diffusing through. Thus, residual copper material generated during the chemical mechanical polishing of an embedded end of a copper via structure can be smeared onto an end surface of the silicon oxide dielectric liner, and subsequently diffuse through the silicon oxide dielectric liner and into a semiconductor material within the substrate. Diffusion of such residual copper material into the semiconductor material can create detrimental effects such as electrical shorts within semiconductor devices in the substrate.

BRIEF SUMMARY

A through-substrate via (TSV) structure that is immune to metal contamination due to a backside planarization process is provided. After forming a through-substrate via (TSV) trench, a diffusion barrier liner is conformally deposited on the sidewalls of the TSV trench. A dielectric liner is formed by depositing a dielectric material on vertical portions of the diffusion barrier liner. A metallic conductive via structure is formed by subsequently filling the TSV trench. Horizontal portions of the diffusion barrier liner can be removed by an anisotropic etch prior to deposition of a conductive material for the metallic conductive via structure, or can be removed by planarization after removing the horizontal portion of the dielectric liner. The diffusion barrier liner protects the semiconductor material of the substrate during the backside planarization by blocking residual metallic material originating from the metallic conductive via structure from entering into the semiconductor material of the substrate, thereby protecting the semiconductor devices within the substrate from metallic contamination.

According to an aspect of the present disclosure, a semiconductor structure including a semiconductor substrate and a through-substrate via (TSV) structure embedded therein is provided. The TSV structure includes: a diffusion barrier liner that contacts an entirety of a contiguous sidewall around a hole within the semiconductor substrate; a dielectric liner contacting an inner sidewall of the diffusion barrier liner; and a metallic conductive via structure laterally contacting the dielectric liner.

According to another aspect of the present disclosure, a method of forming a semiconductor structure is provided. The method includes: forming at least one semiconductor device on a first surface of a semiconductor substrate; forming a trench in the semiconductor substrate, wherein a semiconductor material of the semiconductor substrate is exposed at a sidewall of the trench; forming a diffusion barrier liner directly on the sidewall; forming a metallic conductive via structure by filling the trench with a conductive fill material; and thinning the semiconductor substrate, wherein the metallic conductive via structure extends at least from the first surface to a second surface of the semiconductor substrate after the thinning, wherein the second surface is located on an opposite side of the first surface.

DETAILED DESCRIPTION

Figure 1:
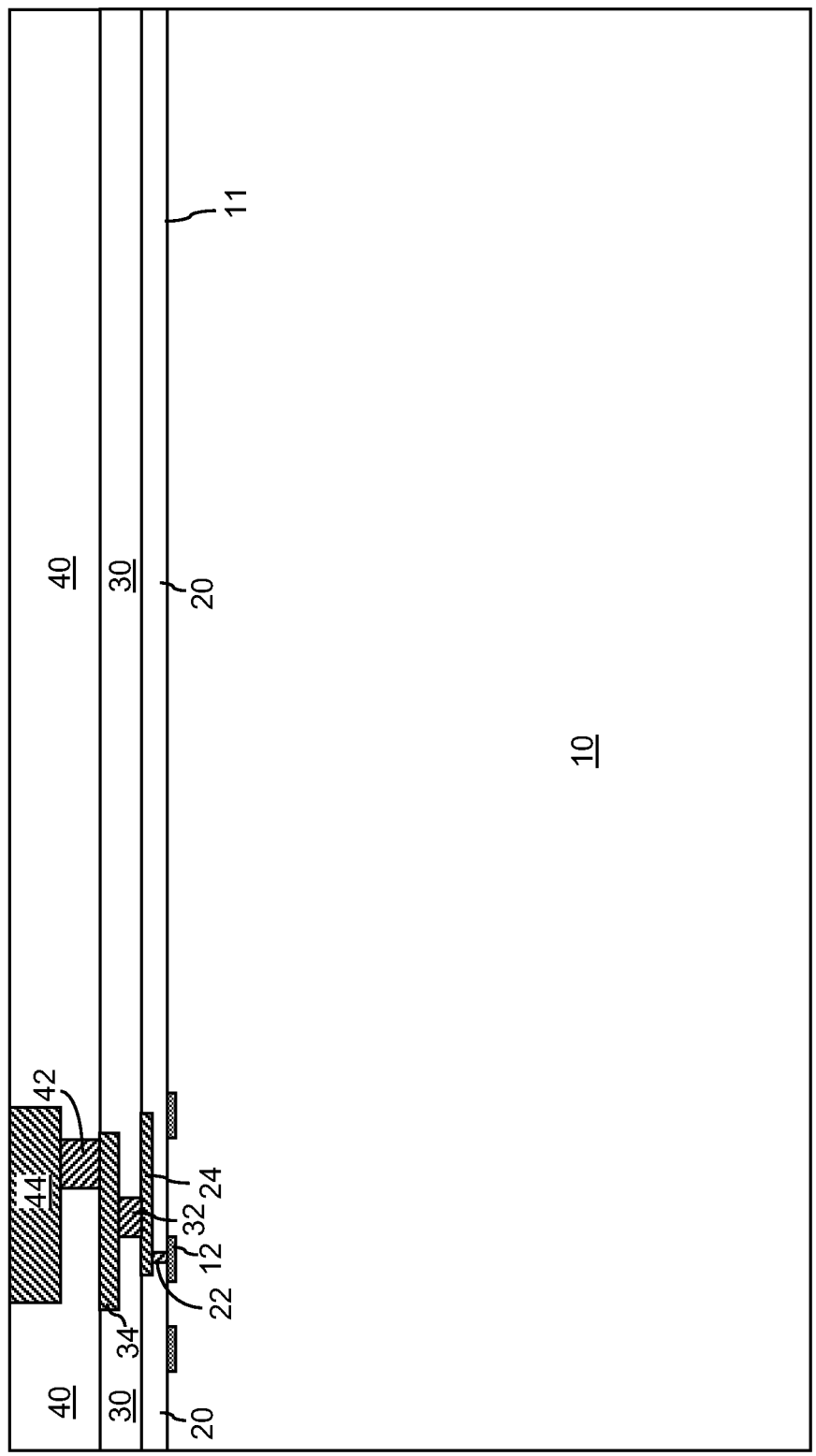
FIG. 1 is a vertical cross-sectional view of a first exemplary semiconductor structure before forming at least one trench in a substrate according to a first embodiment of the present disclosure.

As stated above, the present disclosure relates to metal-contamination-free through-substrate via structures and methods of manufacturing the same, which are now described in detail with accompanying figures. Throughout the drawings, the same reference numerals or letters are used to designate like or equivalent elements. The drawings are not necessarily drawn to scale.

As used herein, a "conductive through-substrate via (TSV) structure" is a conductive structure that extends through a substrate, i.e., at least from a top surface of the substrate to a bottom surface of the substrate.

As used herein, a surface is "substantially planar" if the surface is intended to be planar and the non-planarity of the surface is limited by imperfections inherent in the processing steps that are employed to form the surface.

As used herein, a "mounting structure" is any structure to which a semiconductor chip can be mounded by making electrical connections thereto. A mounting structure can be a packaging substrate, an interposer structure, or another semiconductor chip.

As used herein, a first element is "conductively connected" to a second element if there exists an electrically conductive path between said first element and said second element.

Referring to FIG. 1, a first exemplary semiconductor structure according to a first embodiment of the present disclosure includes a semiconductor substrate 10. The semiconductor substrate 10 includes a semiconductor material, which can be selected from, but is not limited to, silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The semiconductor substrate 10 may be a bulk substrate, a semiconductor-on-insulator (SOI) substrate, or a hybrid substrate having a bulk portion and an SOI portion. At least an upper portion of the semiconductor substrate 10 includes a semiconductor material region in which at least one semiconductor device 12 such as transistors, diodes, capacitors, inductors, and/or resistors employing methods known in the art.

Lower interconnect-level structures are formed on the front surface 11 of the semiconductor substrate 10. The front surface 11 is the surface of the semiconductor substrate on which the at least one semiconductor device is located. At least a portion of the front surface 11 includes a semiconductor material. The lower interconnect-level structures include lower interconnect-level dielectric layers and lower interconnect-level conductive structures embedded therein. As an illustrative example, the lower interconnect-level dielectric layers can include a first lower interconnect-level dielectric layer 20, a second lower interconnect-level dielectric layer 30, and a third lower interconnect-level dielectric layer 40. The lower interconnect-level conductive structures can include a first lower interconnect-level via structure 22 and a first lower interconnect-level line structure 24 that are embedded in the first lower interconnect-level dielectric layer 20, a second lower interconnect-level via structure 32 and a second lower interconnect-level line structure 34 that are embedded in the second lower interconnect-level dielectric layer 30, and a third lower interconnect-level via structure 42 and a third lower interconnect-level line structure 44 that are embedded in the third lower interconnect-level dielectric layer 40. The lower interconnect-level dielectric layers (20, 30, 40) can include a dielectric material such as organosilicate glass (OSG), an undoped silicate glass (USG), a doped silicate glass, silicon nitride, or any other known dielectric material employed as a back-end-of-line dielectric material. The lower interconnect-level conductive structures (22, 24, 32, 34, 42, 44) can be, for example, Cu, Al, Ag, Ti, Ta, W, TiN, TaN, WN, CoWP, and/or combinations or alloys thereof. The topmost surface of the lower interconnect-level structures (20, 30, 40, 22, 24, 32, 34, 42, 44) is planarized.

Figure 2A:
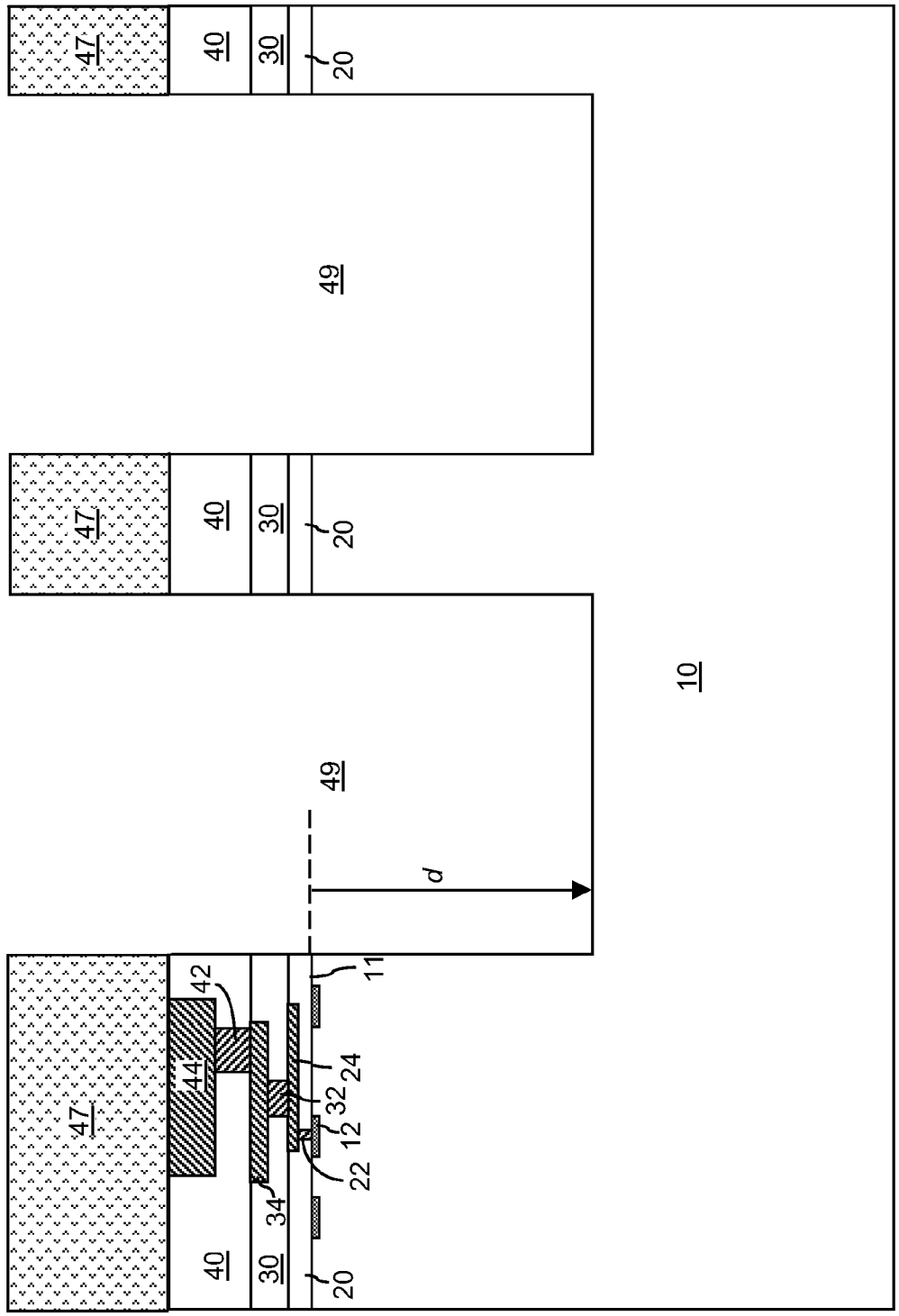
FIG. 2A is a vertical cross-sectional view of the first exemplary semiconductor structure after forming at least one trench in the substrate according to the first embodiment of the present disclosure.
Figure 2B:
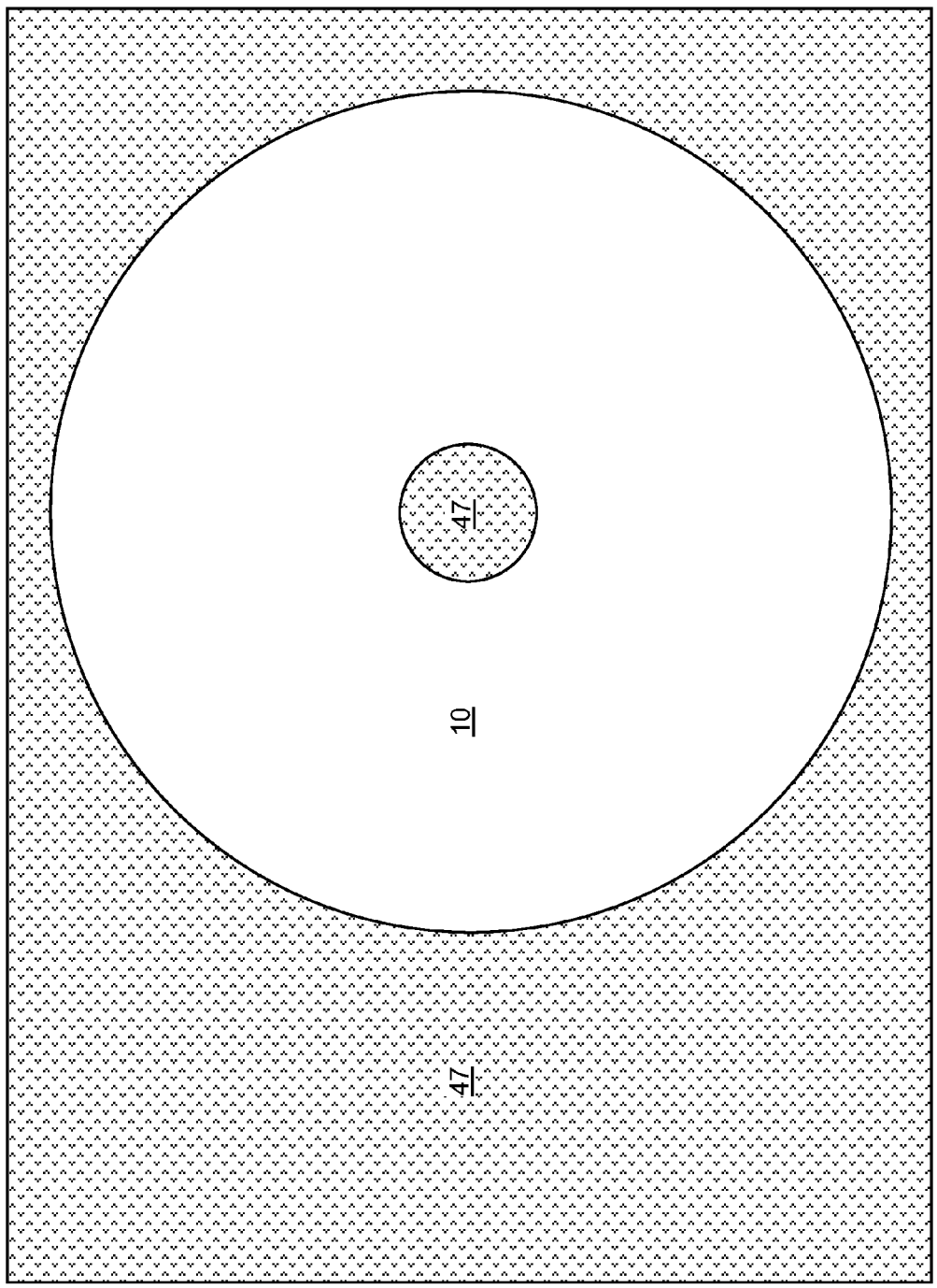
FIG. 2B is a top-down view of the first exemplary semiconductor structure of FIG. 2A according to the first embodiment of the present disclosure.

Referring to FIGS. 2A and 2B, a masking layer 47 is formed on the top surface of the lower interconnect-level structures (20, 30, 40, 22, 24, 32, 34, 42, 44), and is subsequently lithographically patterned. The masking layer 47 can be a softmask layer, i.e., a photoresist layer, or a hardmask layer including an etch-resistant dielectric material that is different from the dielectric material of the topmost layer of the lower interconnect-level structures (20, 30, 40, 22, 24, 32, 34, 42, 44), e.g., the third lower interconnect-level dielectric layer 40. If the masking layer 47 is a hardmask layer, a photoresist layer (not shown) may be applied to the top surface of the masking layer 47 and lithographically patterned, and the pattern in the photoresist layer may be transferred into the hardmask layer to provide a patterned masking layer 47. If the masking layer 47 is a photoresist layer, the photoresist layer can be patterned by lithographic exposure and development.

The pattern in the masking layer 47 is subsequently transferred into the lower interconnect-level structures (20, 30, 40, 22, 24, 32, 34, 42, 44) and the upper portion of the semiconductor substrate 10 by an anisotropic etch to form at least one trench 49. The cross-sectional shape of each trench 49 may have, but does not need to have, an annular shape as illustrated in FIG. 2B. A semiconductor material of the semiconductor substrate 10 is exposed at sidewalls of the at least one trench 49. The depth d of the at least one trench 49 as measured from the front surface 11 of the semiconductor substrate 10 can be from 20 microns to 200 microns, and typically from 40 microns to 100 microns, although lesser and greater depths can also be employed. The lateral dimension of the at least one trench 49, i.e., the smallest lateral distance between two different sidewalls of one of the at least one trench 49, can be from 2 microns to 20 microns, and typically from 4 microns to 10 microns, although lesser and greater lateral dimensions can also be employed. For example, in case the horizontal cross-sectional area of a trench 49 is an annulus, the lateral dimension of that trench 49 can be the difference between the radius of the outer sidewall and the radius of the inner sidewall, and can be from 2 microns to 20 microns, and typically from 4 microns to 10 microns. The annular shape for a trench 49 is only an illustrative example, and a trench 49 can have any horizontal cross-sectional shape provided that filling of the trench 49 with a conductive material in subsequent processing steps is possible after depositing the liners of the present disclosure. The masking layer 47 is subsequently removed selective to exposed dielectric materials of the lower interconnect-level structures (20, 30, 40, 22, 24, 32, 34, 42, 44).

Figure 3:
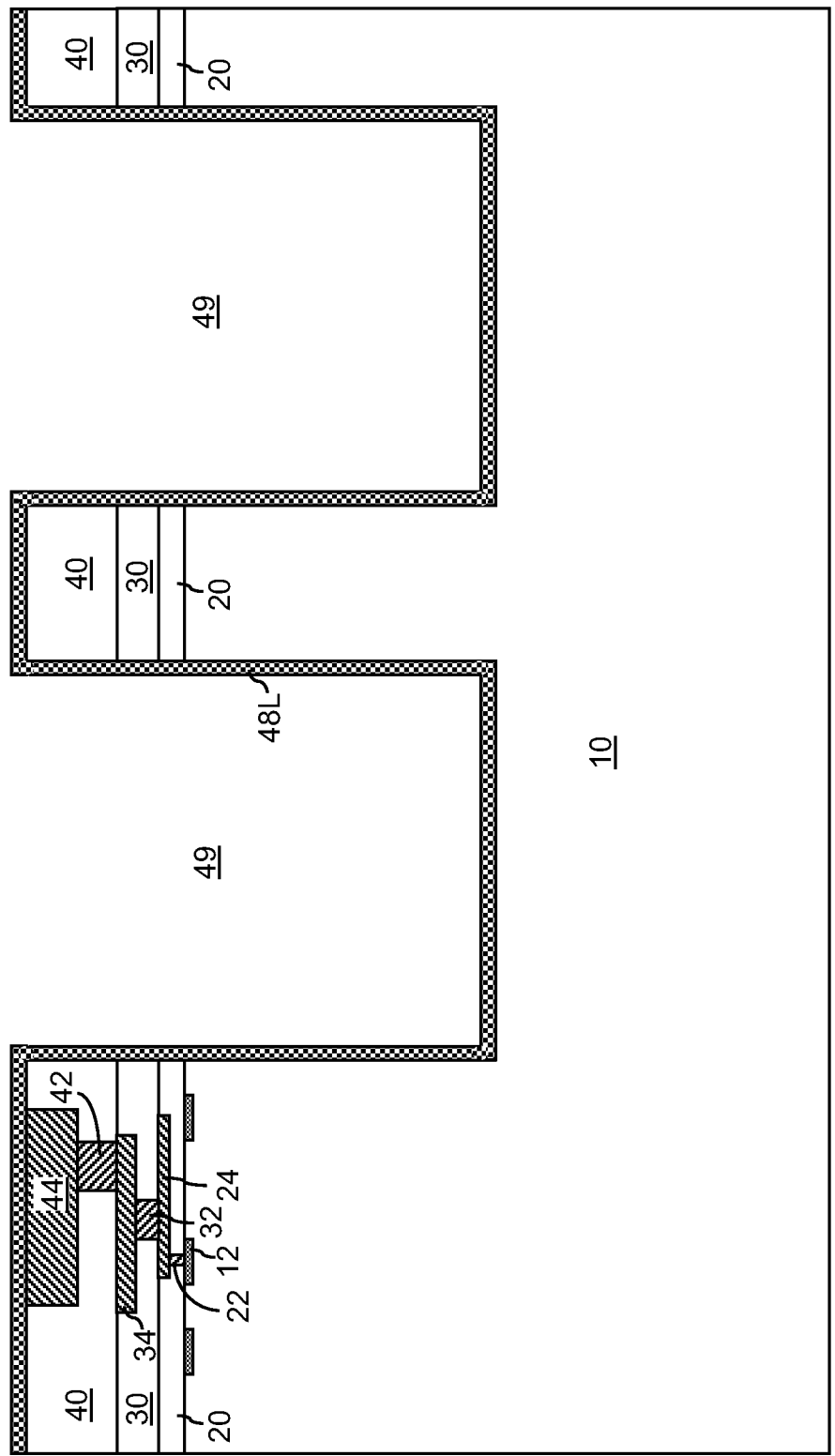
FIG. 3 is a vertical cross-sectional view of the first exemplary semiconductor structure after depositing a contiguous diffusion barrier layer according to the first embodiment of the present disclosure.

Referring to FIG. 3, a contiguous diffusion barrier layer 48L is deposited on the bottom surfaces and the sidewalls of the at least one trench 49 and the topmost surface of the lower interconnect-level structures (20, 30, 40, 22, 24, 32, 34, 42, 44). The contiguous diffusion barrier layer 48L covers all surfaces of the first exemplary semiconductor structure and the sidewall surfaces of the at least one trench 49 contiguously.

In one embodiment, the contiguous diffusion barrier layer 48L includes a conductive material. The contiguous diffusion barrier layer 48L may consist of a single homogeneous conductive material, or may include a plurality of conductive material layers having different compositions. Specifically, the conductive material of the contiguous diffusion barrier layer 48L can include at least one conductive metallic nitride. Non-limiting exemplary materials for the conductive metallic nitride include TiN, TaN, WN, TiAlN, and TaCN. Alternately or additionally, the conductive material of the contiguous diffusion barrier layer 48L can include an elemental metal that does not diffuse into semiconductor materials. Such elemental metals include Ta, Ti, W, and Mo. Yet alternately or additionally, the conductive material of the contiguous diffusion barrier layer 48L can include an electroplatable material, which can be selected from a CoW alloy and a CoWP alloy. The conductive materials of the contiguous diffusion barrier layer 48L functions as a diffusion barrier for metallic materials, i.e., blocks diffusion of metallic materials into the semiconductor material of the semiconductor substrate 10.

The various conductive materials, which may be employed for the contiguous diffusion barrier layer 48L as a sole component or as one of many component conductive layers, can be deposited as a contiguous layer by chemical vapor deposition (CVD), atomic layer deposition (ALD), evaporation, physical vapor deposition (PVD, i.e., sputtering), electroplating, electroless plating, or a combination thereof. The thickness of each conductive component layer of the contiguous diffusion barrier layer 48L can be from 1 nm to 100 nm. The total thickness of the contiguous diffusion barrier layer 48L can be from 5 nm to 100 nm, although lesser and greater thicknesses can also be employed.

In another embodiment, the contiguous diffusion barrier layer 48L includes a dielectric material. The contiguous diffusion barrier layer 48L may consist of a single homogeneous dielectric material, or may include a plurality of dielectric material layers having different compositions. Specifically, the dielectric material of the contiguous diffusion barrier layer 48L can include a metal-oxide-containing dielectric material. Non-limiting exemplary materials for the metal-oxide-containing dielectric material include at least one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAl_xN_y$, $Y_2O_xN_y$, a silicate thereof, and an alloy thereof, and non-stoichiometric variants thereof, wherein each value of x is independently from about 0.5 to about 3 and each value of y is independently from 0 to about 2. Alternately or additionally, the dielectric material of the contiguous diffusion barrier layer 48L can include at last one material selected from silicon carbide and $SiN_xC_yH_z$, wherein each value of x, y, and z is independently from 0 to about 1. Yet alternately or additionally, the dielectric material of the contiguous diffusion barrier layer 48L can include silicon nitride. The dielectric materials of the contiguous diffusion barrier layer 48L functions as a diffusion barrier for metallic materials, i.e., blocks diffusion of metallic materials into the semiconductor material of the semiconductor substrate 10.

The various dielectric materials, which may be employed for the contiguous diffusion barrier layer 48L as a sole component or as one of many component dielectric layers, can be deposited as a contiguous layer by chemical vapor deposition (CVD), atomic layer deposition (ALD), spray coating, or a combination thereof. Methods of depositing $SiN_xC_yH_z$, wherein each value of x, y, and z is independently from 0 to about 1 are known in the art, and can be found, for example, in U.S. Pat. No. 7,009,280 to Angyal et al. The contents of the '280 Patent related to deposition of $SiN_xC_yH_z$ is incorporated herein by reference. The thickness of each dielectric component layer of the contiguous diffusion barrier layer 48L can be from 5 nm to 200 nm. The total thickness of the contiguous diffusion barrier layer 48L can be from 5 nm to 100 nm, although lesser and greater thicknesses can also be employed.

In yet another embodiment, the contiguous diffusion barrier layer 48L includes a combination of at least one dielectric material layer and at least one conductive material layer. The dielectric materials and the conductive materials that can be independently employed for the contiguous diffusion barrier layer 48L can also be employed in combination. The total thickness of the contiguous diffusion barrier layer 48L can be from 5 nm to 100 nm, although lesser and greater thicknesses can also be employed.

Figure 4:
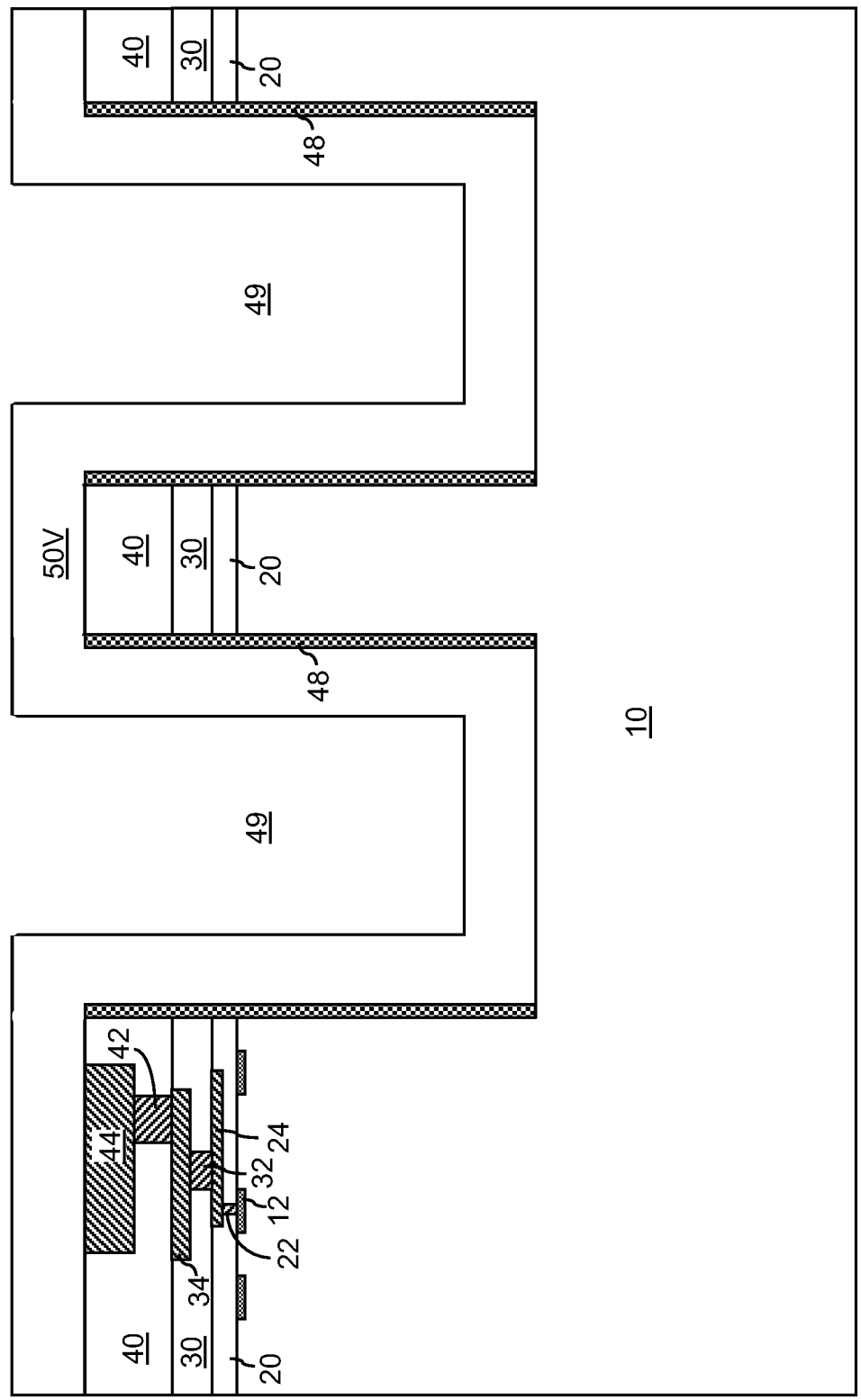
FIG. 4 is a vertical cross-sectional view of the first exemplary semiconductor structure after removing horizontal portions of the contiguous diffusion barrier layer and deposition of a dielectric liner according to the first embodiment of the present disclosure.

Referring to FIG. 4, horizontal portions of the contiguous diffusion barrier layer 48L is removed by an anisotropic etch, which can be a reactive ion etch that selectively removes the material(s) of the contiguous diffusion barrier layer 48 relative to the materials on the top surface of the lower interconnect-level structures (20, 30, 40, 22, 24, 32, 34, 42, 44). The remaining vertical portions of the contiguous diffusion barrier layer 48L constitute diffusion barrier liners 48, which are present only on the sidewalls of the at least one trench 49. The bottom surface(s) of the at least one trench 49 is/are exposed after the anisotropic etch. In an illustrative example, a trench 49 has an annular shape, a pair of diffusion barrier liners 48, i.e., an inner diffusion barrier layer and an outer diffusion barrier layer, is formed on the sidewalls of the trench 49.

A dielectric liner 50V is contiguously deposited directly on the topmost surfaces of the lower interconnect-level structures (20, 30, 40, 22, 24, 32, 34, 42, 44), the inner sidewalls of the diffusion barrier liners 48, and the bottom surface of the at least one trench 49. The dielectric liner 50V includes a dielectric material such as undoped silicate glass (USG), a doped silicate glass, an organosilicate glass, or a combination thereof. The dielectric liner 50V promotes adhesion of metallic conductive via structures to be subsequently formed within the at least one trench 49. The thickness of the dielectric liner 50V, as measured horizontally from an inner sidewall of a diffusion barrier liner 48, can be from 50 nm to 1 micron, and typically from 150 nm to 500 nm, although lesser and greater thicknesses can also be employed. The dielectric liner 50V can be deposited, for example, by chemical vapor deposition (CVD).

Figure 5:
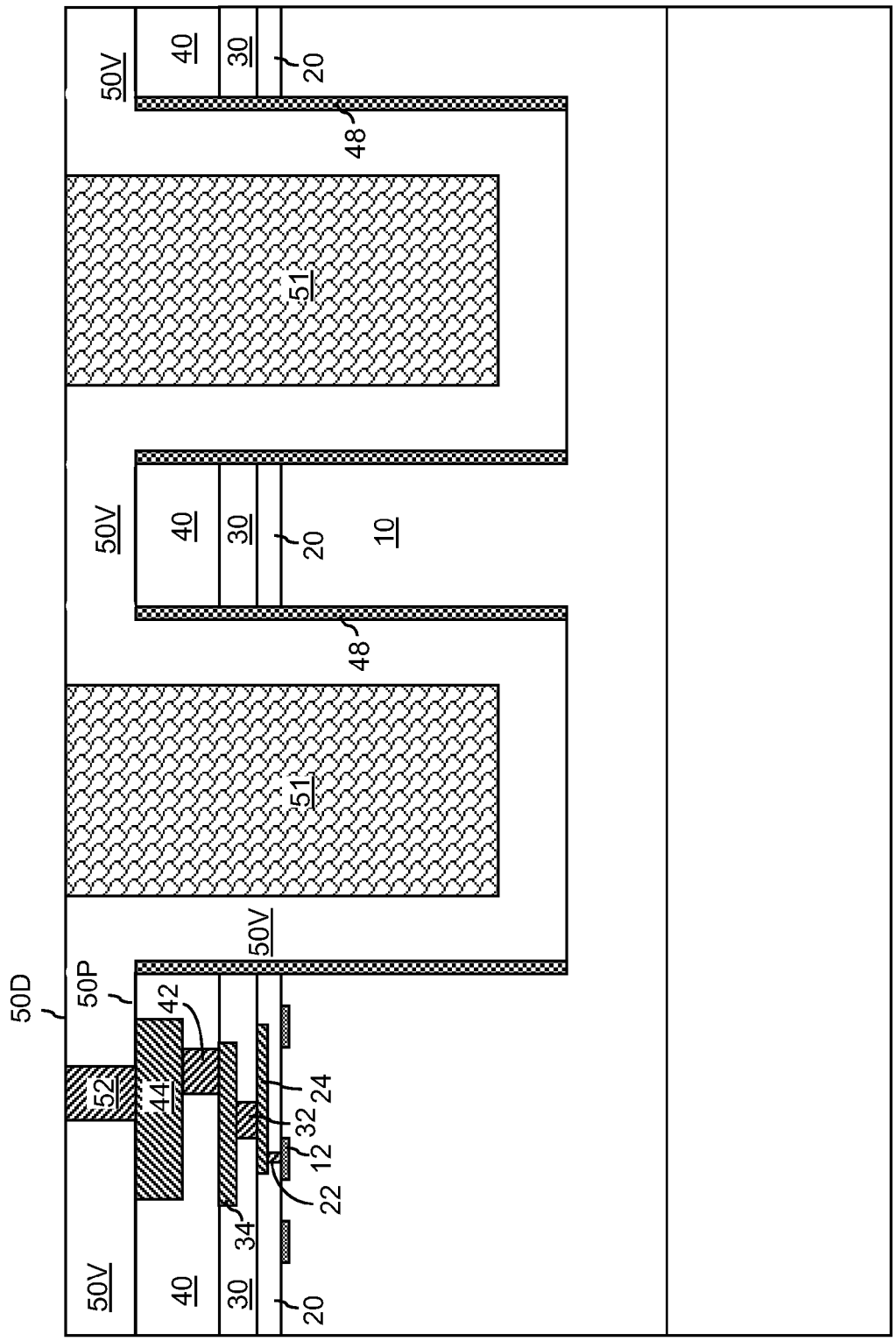
FIG. 5 is a vertical cross-sectional view of the first exemplary semiconductor structure after depositing a metallic conductive via structure according to the first embodiment of the present disclosure.

Referring to FIG. 5, a metallic conductive via structure 51 is formed in each of the at least one trench 49 by filling the at least one trench 49 with a conductive material. The conductive material can be deposited, for example, by electroplating, electroless plating, physical vapor deposition, chemical vapor deposition, or a combination thereof. The excess conductive material deposited over the topmost surface of the dielectric liner 50V, which is herein referred to as a distal horizontal surface 50D, is removed by a planarization process. The planarization process can employ chemical mechanical planarization, a recess etch, or a combination thereof. Materials that can be employed for the at least one metallic conductive via structure 51 include Cu, W, CoW, CoWP, Au, Al, and Ag. In addition, at least one metallic liner (not shown) can be optionally deposited between the dielectric liner 50V and the at least one metallic conductive via structure 51. Materials that can be employed for a metallic liner include TiN, TaN, WN, TiAlN, and TaCN.

At least one dielectric-liner-level metal interconnect structure 52 can be formed through the dielectric liner 50V to provide an electrically conductive path to the lower interconnect-level conductive structures (22, 24, 32, 34, 42, 44) before, concurrently with, or after formation of the at least one metallic conductive via structure 51. The dielectric liner 50V includes a horizontal portion having the distal horizontal surface 50D and a proximal horizontal surface 50P. The distal horizontal surface 50D is the topmost surface of the dielectric liner 50V, and is coplanar with an end surface of the at least one metallic conductive via structure 51. The topmost surfaces of the diffusion barrier liners 48 are coplanar with the horizontal proximal surface 50P. The distal horizontal surface 50D is farther away from the at least one semiconductor device 12 than the proximal horizontal surface 50P. The diffusion barrier liners 48 do not contact the topmost surface of the dielectric liner 50V.

Figure 6:
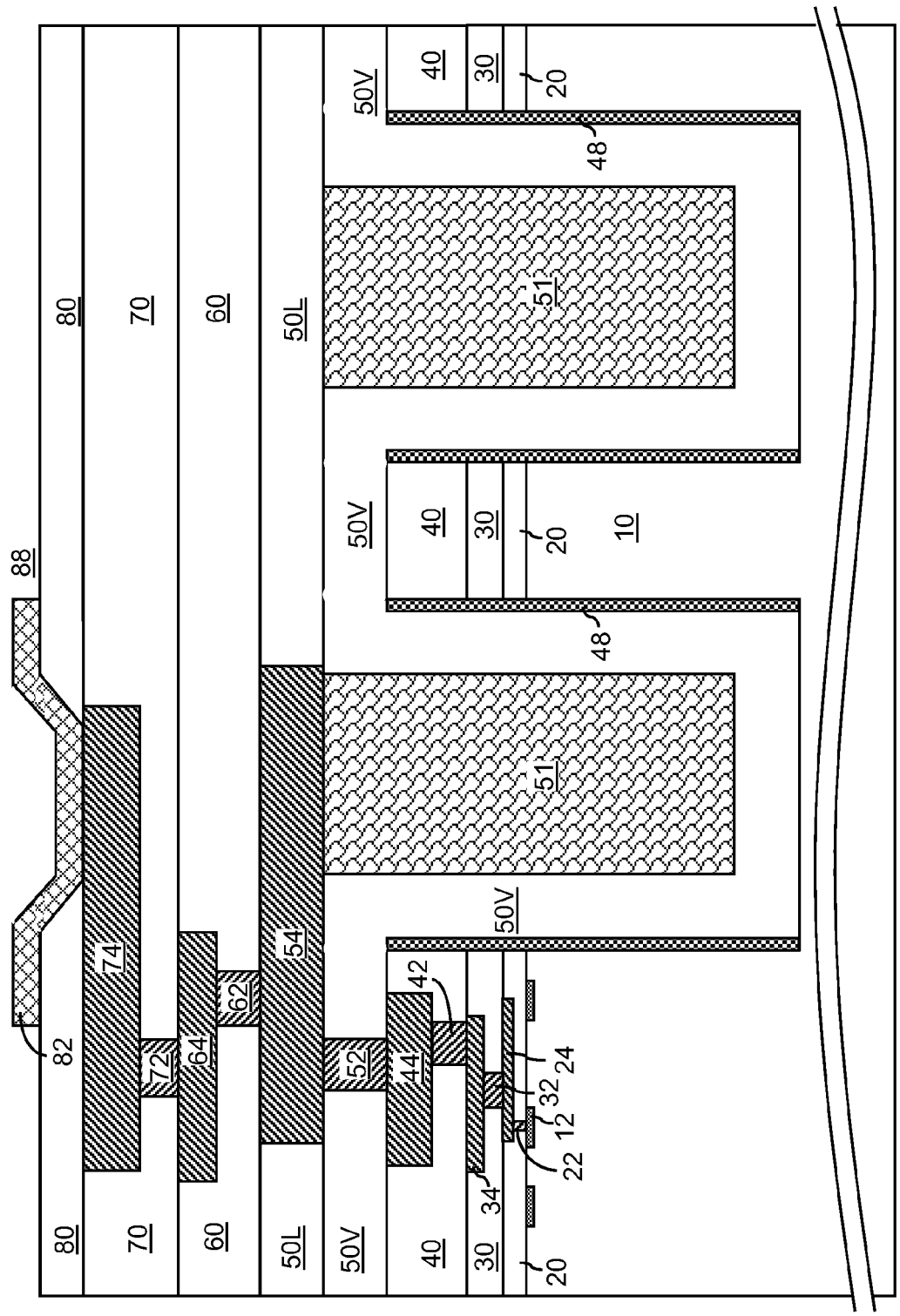
FIG. 6 is a vertical cross-sectional view of the first exemplary semiconductor structure after forming upper interconnect-level structures according to the first embodiment of the present disclosure.

Referring to FIG. 6, upper interconnect-level structures are formed over the planar surfaces of the dielectric layer 50V and the at least one metallic conductive via structure 51. The upper interconnect-level structures include upper interconnect-level dielectric layers and upper interconnect-level conductive structures embedded therein. As an illustrative example, the upper interconnect-level dielectric layers can include a first upper interconnect-level dielectric layer 50L, a second upper interconnect-level dielectric layer 60, and a third upper interconnect-level dielectric layer 70. The upper interconnect-level conductive structures can include a first upper interconnect-level structure 54 that is embedded in the first upper interconnect-level dielectric layer 50L, a second upper interconnect-level via structure 62 and a second upper interconnect-level line structure 64 that are embedded in the second upper interconnect-level dielectric layer 60, and a third upper interconnect-level via structure 72 and a third upper interconnect-level line structure 74 that are embedded in the third upper interconnect-level dielectric layer 70. The upper interconnect-level dielectric layers (50L, 60, 70) can include a dielectric material such as organosilicate glass (OSG), an undoped silicate glass (USG), a doped silicate glass, silicon nitride, or any other known dielectric material employed as a back-end-of-line dielectric material. The upper interconnect-level conductive structures (54, 62, 64, 72, 74) can be, for example, Cu, Al, Ag, Ti, Ta, W, TiN, TaN, WN, CoWP, and/or combinations or alloys thereof. The topmost surface of the upper interconnect-level structures (50L, 60, 70, 54, 62, 64, 72, 74) is planarized.

The upper interconnect-level structures can further include a passivation layer 80, which blocks ingress of impurity materials and moisture into the structures underneath. Thus, the passivation layer 80 includes a dielectric material that blocks diffusion of impurity materials and moisture. For example, the passivation layer 80 can include a silicon nitride layer. The thickness of the passivation layer 80 can be from 100 nm to 2 microns, and typically from 200 microns to 500 microns, although lesser and greater thicknesses can also be employed. At least one opening can be formed in the passivation layer 80 and a front side metal pad 82 can be formed in each of the at least one opening to provide an electrically conductive path through the passivation layer 80. Each of the at least one front side metal pad 82 is conductively connected to one of the at least one semiconductor device 12. The at least one front side metal pads 82 includes a metal such as copper, nickel, aluminum, or an alloy or a combination thereof. Each of the at least one front side metal pads 82 can be a C4 pad on which a C4 ball can be subsequently bonded.

Figure 7:
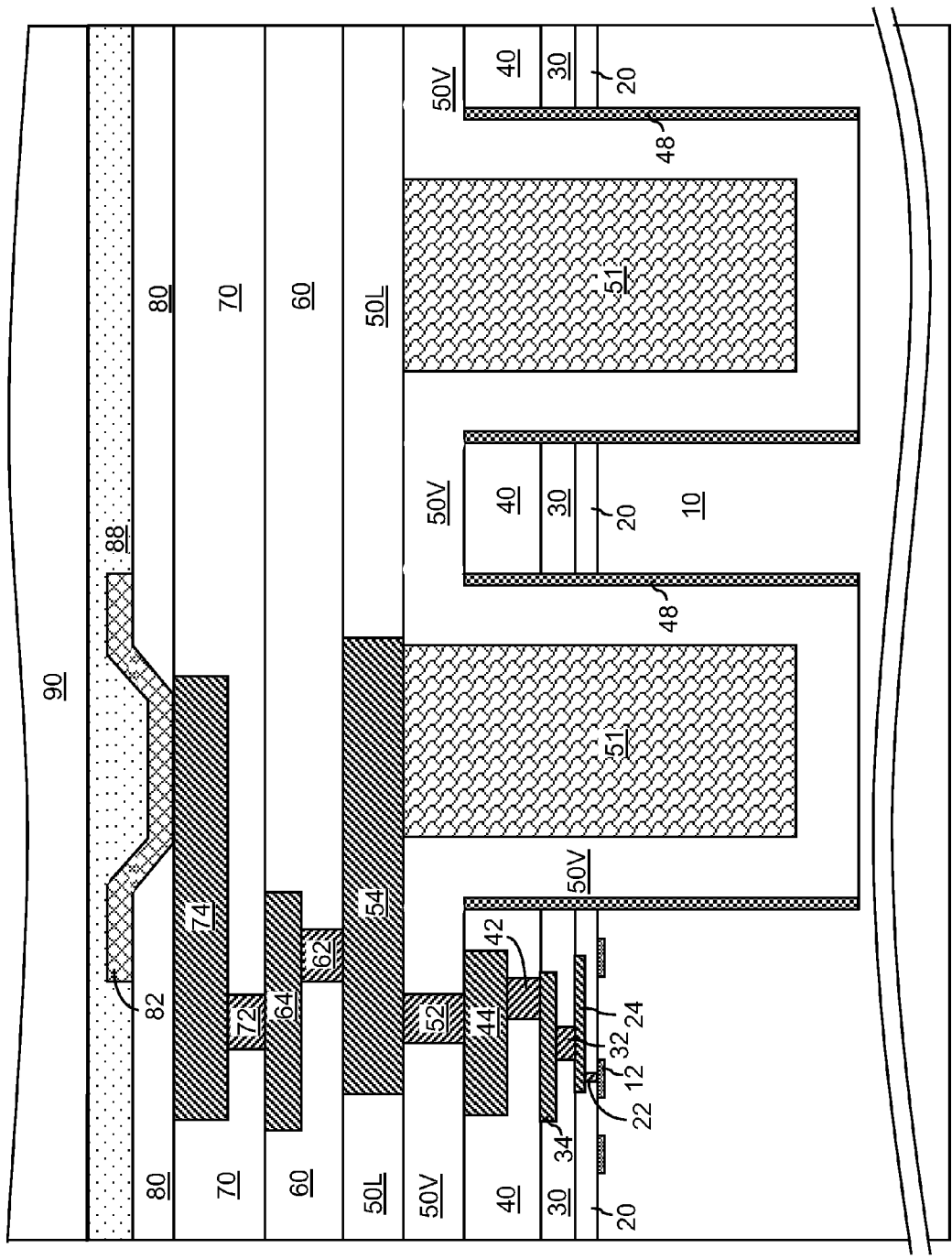
FIG. 7 is a vertical cross-sectional view of the first exemplary semiconductor structure after attaching a handle substrate according to the first embodiment of the present disclosure.

Referring to FIG. 7, a handle substrate 90 can be attached to the assembly of the substrate 10 and the embedded components therein, the lower interconnect-level structures (20, 30, 40, 22, 24, 32, 34, 42, 44), the dielectric liner 50V and the components embedded therein, and the upper interconnect-level structures (50L, 60, 70, 54, 62, 64, 72, 74). For example, an adhesive layer 88 can be applied to the exposed surfaces of the passivation layer 88 and the handle substrate 90 can be attached to the adhesive layer 88.

The adhesive layer 88 can be polymer-based, solvent-based, resin-based, elastomer-based, or based on any other type of bonding mechanism provided that the handle substrate 90 or the assembly of the passivation layer 88 and the at least one front side metal pad 82 can be dissociated from the adhesive layer 88 under suitable conditions. The handle substrate 90 is thick enough to provide mechanical support for handling after subsequent thinning of the semiconductor substrate 10. For example, the handle substrate 90 can be a glass substrate having a thickness from 500 microns to 2 mm, and typically from 750 microns to 1,250 microns. In one embodiment, the lateral dimensions of the handle substrate 90 match the lateral dimensions of the semiconductor substrate 10. For example, if the semiconductor substrate 10 has a diameter of 300 mm, the handle substrate 90 can have a diameter about 300 mm.

Figure 8:
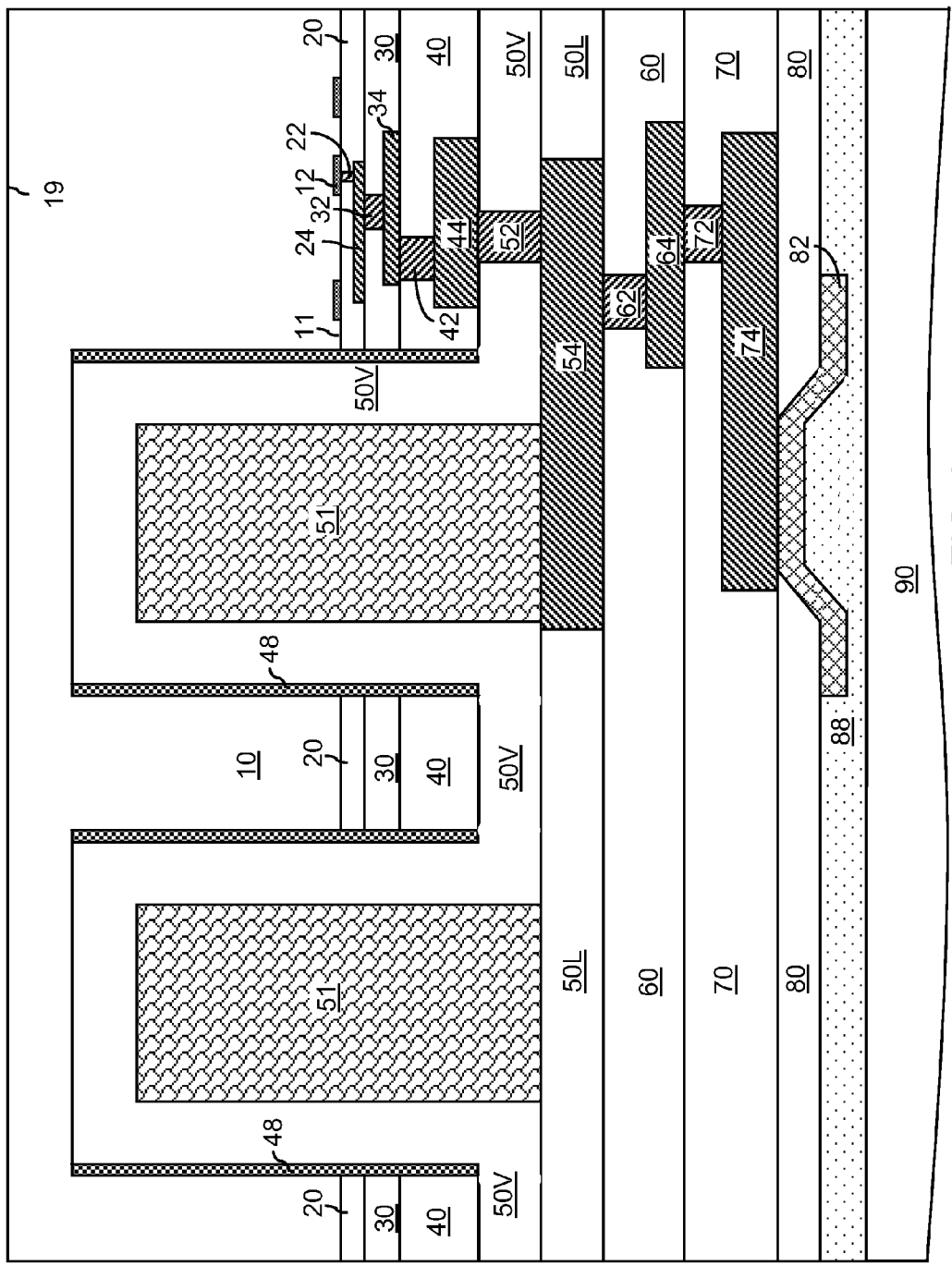
FIG. 8 is a vertical cross-sectional view of the first exemplary semiconductor structure after removing a backside portion of the substrate according to the first embodiment of the present disclosure.

Referring to FIG. 8, the semiconductor substrate 10 can be flipped upside down and thinned by removing a back side portion of the semiconductor substrate 10. Specifically, the back side portion of the semiconductor substrate 10 is removed, for example, by grinding, cleaving, polishing, a recess etch, or a combination thereof. After this thinning step, the dielectric liner 50V and the diffusion barrier liners 48 are not exposed. The thickness of the semiconductor substrate 10, i.e., the distance between the front surface 11 and the back surface 19 of the semiconductor substrate 10, exceeds the depth d of the at least one trench 49 at the end of the processing steps of FIGS. 2A and 2B. For example, the thickness of the semiconductor substrate 10 can be from 25 microns to 300 microns, and typically from 45 microns to 150 microns, although lesser and greater thicknesses can also be employed.

Figure 9:
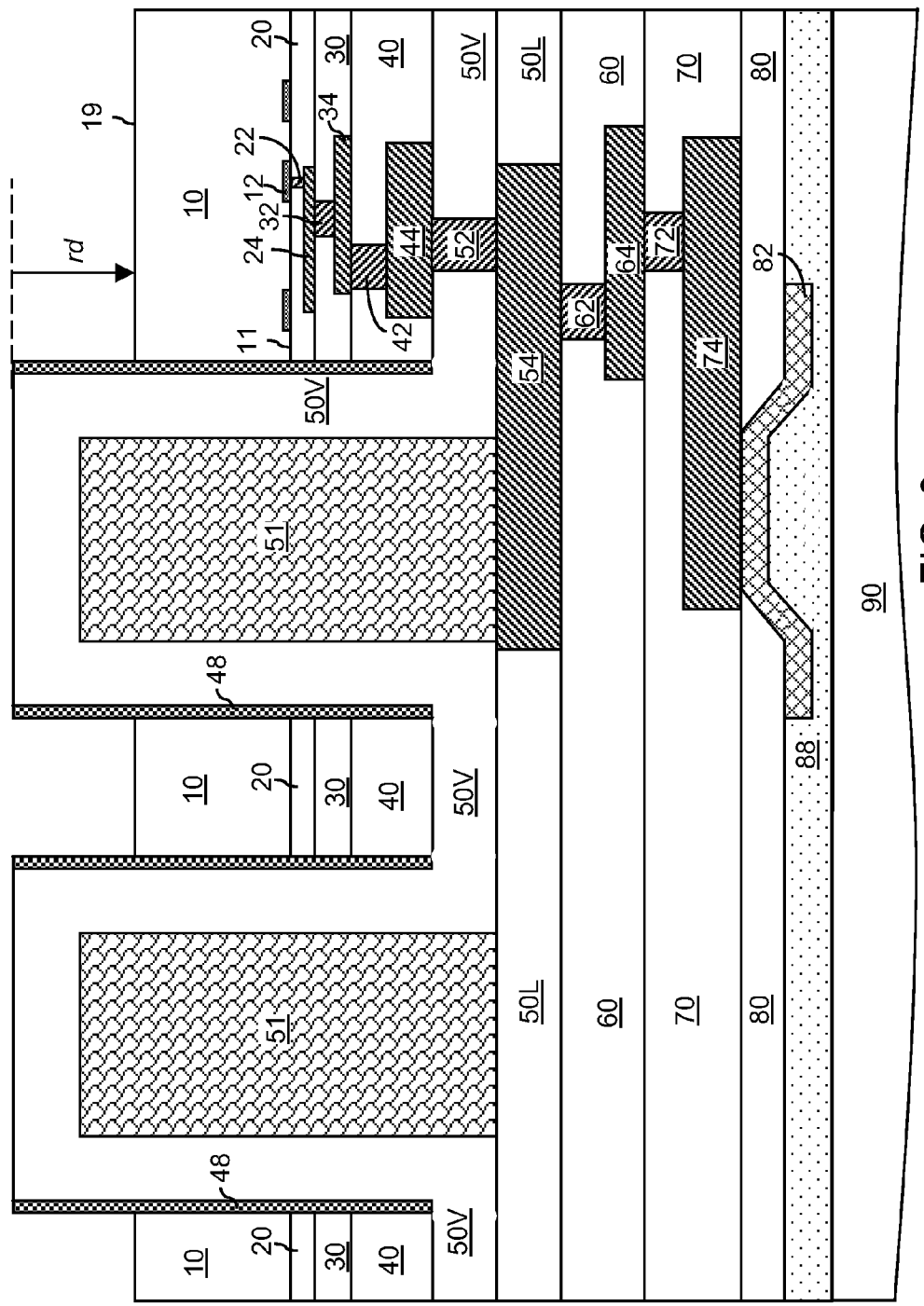
FIG. 9 is a vertical cross-sectional view of the first exemplary semiconductor structure after recessing a backside semiconductor surface according to the first embodiment of the present disclosure.

Referring to FIG. 9, the thinning of the semiconductor substrate 10 is continued employing an etch. The etch removes the material of the semiconductor substrate 10 selective to the material of the dielectric liner 50V and the material(s) of the diffusion barrier liners 48. The etch may be an anisotropic etch or an isotropic etch. Further, this etch may be a dry etch or a wet etch. The etch continues after the horizontal surfaces of the dielectric liner 50V and the material(s) of the diffusion barrier liners 48 are exposed until the back surface 19 of the semiconductor substrate 10 is recessed to a recess depth rd relative to the horizontal surfaces of the dielectric liner 50V. The recess depth rd is greater than the thickness of the dielectric liner 50V, and can be from 1 micron to 10 microns, and typically from 2 microns to 5 microns, although lesser and greater recess depths can also be employed. At this step, the at least one metallic conductive via structure 51 extends at least from the first surface of the semiconductor substrate, i.e., the front surface 11 to a second surface of the semiconductor substrate 10, i.e., the back surface 19 that is located on an opposite side of the front surface 11.

Figure 10:
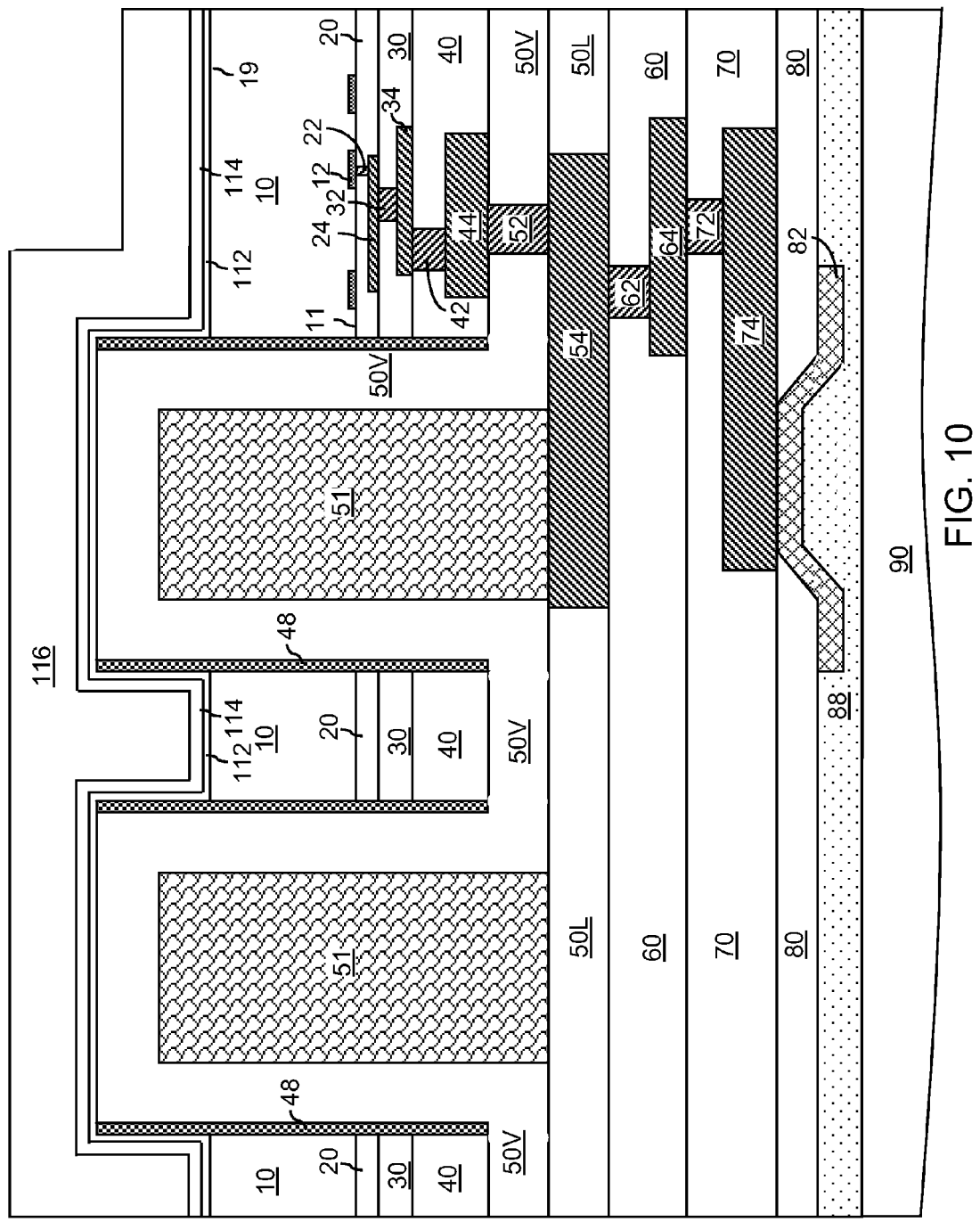
FIG. 10 is a vertical cross-sectional view of the first exemplary semiconductor structure after depositing backside dielectric layers according to the first embodiment of the present disclosure.

Referring to FIG. 10, backside dielectric layers are deposited on the back side of the semiconductor substrate 10. For example, a first backside dielectric layer 112, a second backside dielectric layer 114, and a third backside dielectric layer 116 can be sequentially deposited on the back surface 19 of the semiconductor substrate 10, the exposed sidewalls of the diffusion barrier liners 48, and the exposed horizontal surfaces of the dielectric liner 50V.

In one embodiment, at least one of the backside dielectric layers (112, 114, 116) can include a dielectric material that blocks diffusion of metallic materials. The dielectric material that blocks diffusion of metallic materials can be any material that can be employed as a dielectric material of the contiguous diffusion barrier layer 48L. For example, at least one of the backside dielectric layers (112, 114, 116) can include a metal-oxide-containing dielectric material. Non-limiting exemplary materials for the metal-oxide-containing dielectric material include at least one of $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof, and non-stoichiometric variants thereof, wherein each value of x is independently from about 0.5 to about 3 and each value of y is independently from 0 to about 2. Alternately or additionally, the dielectric material of the at least one of the backside dielectric layers (112, 114, 116) can include at last one material selected from silicon carbide and $SiN_xC_yH_z$, wherein each value of x, y, and z is independently from 0 to about 1. Yet alternately or additionally, the dielectric material of the at least one of the backside dielectric layers (112, 114, 116) can include silicon nitride. The dielectric materials of the at least one of the backside dielectric layers (112, 114, 116) functions as a diffusion barrier for metallic materials, i.e., blocks diffusion of metallic materials into the semiconductor material of the semiconductor substrate 10 through the back surface 19.

In one embodiment, the first backside dielectric layer 112 can include at least one dielectric material that functions as a diffusion barrier for metallic materials. In another embodiment, one of the backside dielectric layers (112, 114, 116) can include an adhesion-promoting material such as undoped silicate glass. In yet another embodiment, the backside dielectric layers (112, 114, 116) can be a stack of a first backside dielectric layer 112 including silicon oxide, a second backside dielectric layer 114 including silicon nitride or any other dielectric material that functions as a diffusion barrier for metallic materials, and the third backside dielectric layer 116 including silicon oxide. The thicknesses of each of the backside dielectric layers (112, 114, 116) can be optimized as necessary. In general, each of the backside dielectric layers (112, 114, 116) can have a thickness from 50 nm to 2 microns. Typically, the combined thicknesses of the backside dielectric layers (112, 114, 116) can be from 1 micron to 3 microns, although lesser and greater combined thicknesses can also be employed.

Figure 11:
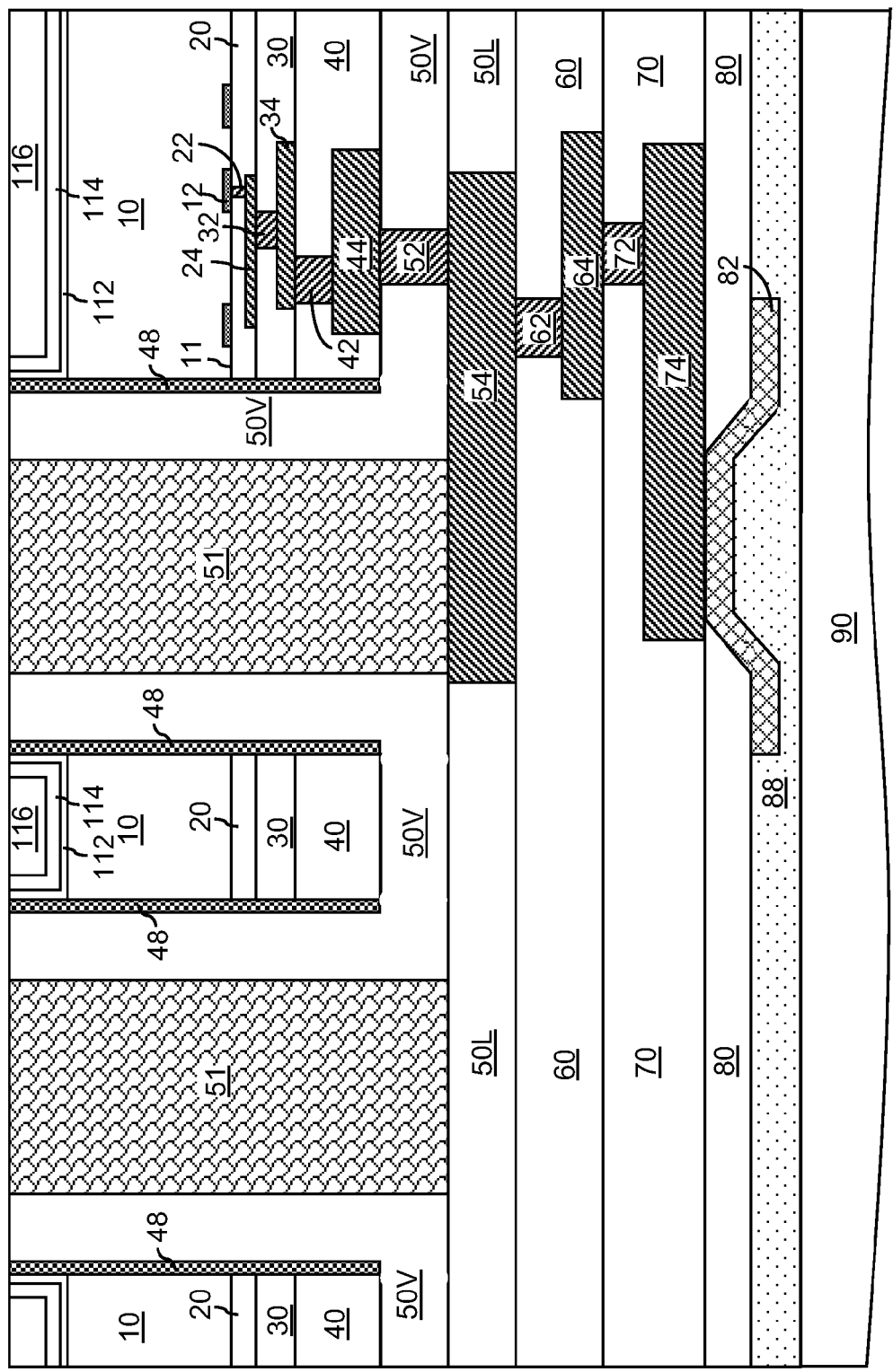
FIG. 11 is a vertical cross-sectional view of the first exemplary semiconductor structure after planarizing backside dielectric layers according to the first embodiment of the present disclosure.

Referring to FIG. 11, the portions of the backside dielectric layers (112, 114, 116) above the at least one metallic conductive via structure 51 and upper portions of the at least one metallic conductive via structure 51, i.e., portions farthest away vertically from the front surface 11 of the semiconductor substrate 10, are removed by planarization, which can be effected by chemical mechanical planarization (CMP). During the planarization process, metallic particles originating from removed portions of the at least one metallic conductive via structure 51 can be smeared to the exposed back side surfaces of the backside dielectric layers (112, 114, 116) located above (as illustrated in FIG. 11) or below (during an actual CMP processing step) the interface with the semiconductor substrate 10. The presence of the diffusion barrier liners 48 ensures that metallic particles smeared onto exposed surfaces of the dielectric liner 50V are stopped at the interfaces between the diffusion barrier liners 48 and the remaining portions of the dielectric liner 50V. Further, the presence of a dielectric material layer that functions as a diffusion barrier for metallic materials among the at least one of the backside dielectric layers (112, 114, 116) prevents metallic particles that are smeared onto the exposed surfaces of the backside dielectric layers (112, 114, 116) from entering the semiconductor substrate 10 through the back side surface 19. Particularly, if the first backside dielectric material layer 112 functions as a diffusion barrier for metallic materials, the back surface 19 and the sidewall surfaces of the semiconductor substrate 10 are contiguously sealed by materials that block the diffusion of metallic materials into the semiconductor substrate 10. Thus, the first exemplary semiconductor structure is immune to backside contamination of metals or reduces the risk of backside metal contamination significantly. After the planarization, the exposed surfaces of the backside dielectric layers (112, 114, 116), the at least one metallic conductive via structure 51, and the diffusion barrier liners 48 are substantially planar among one another.

Figure 12:
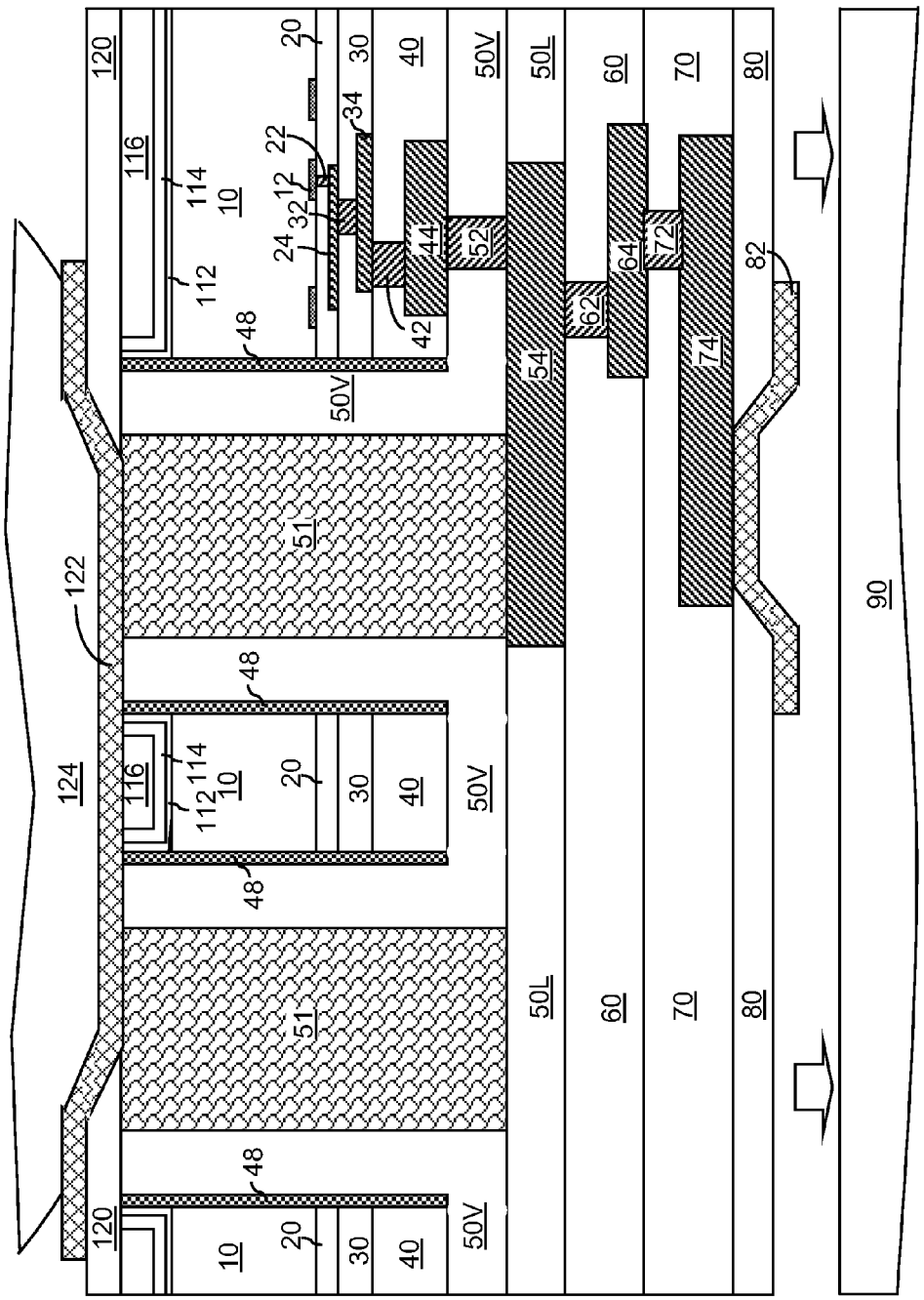
FIG. 12 is a vertical cross-sectional view of the first exemplary semiconductor structure after forming backside metal pads, attaching C4 balls on the backside, and separating the handle substrate from the front side according to the first embodiment of the present disclosure.

Referring to FIG. 12, a backside passivation layer 120 can be deposited on the surfaces of the backside dielectric layers (112, 114, 116) and the at least one metallic conductive via structure 51. The backside passivation layer 120 can include a dielectric material that blocks ingress of impurity materials and moisture into the structures underneath. For example, the backside passivation layer 120 can include a silicon nitride layer. The thickness of the backside passivation layer 120 can be from 100 nm to 2 microns, and typically from 200 microns to 500 microns, although lesser and greater thicknesses can also be employed. At least one opening can be formed in the backside passivation layer 120 and a back side metal pad 122 can be formed in each of the at least one opening to provide an electrically conductive path through the backside passivation layer 120. Each of the at least one back side metal pad 122 can contact a metallic contact via structure 51. The at least one back side metal pads 122 includes a metal such as copper, nickel, aluminum, or an alloy or a combination thereof. Each of the at least one back side metal pads 122 can be a C4 pad on which a C4 ball can be subsequently bonded.

Each of the at least one metallic contact via structure 51 is a conductive through-substrate via (TSV) structure that extends vertically at least from the front surface 11 to the back surface 19 of the semiconductor substrate 10. A mounting structure (not shown) can be subsequently bonded to the back side of the semiconductor substrate 10, for example, by bonding a C4 ball 124 to the at least one back side metal pads 122 and metal pads located on the mounting substrate. Bonding with a mounting structure may be performed without dicing the assembly of the handle substrate 10 and the semiconductor substrate 10 at a wafer level, or can be performed after dicing the assembly of the handle substrate 10 and the semiconductor substrate 10 along dicing channels that correspond to boundaries of individual semiconductor chips. Once a mounting structure is bonded to the semiconductor substrate 10 through C4 balls 124, the handle substrate 90 can be separated from the assembly of the semiconductor substrate 10, an array of C4 balls 124, and the mounting substrate, for example, by cleaving or by dissolving the adhesive layer 88. If the handle substrate 90 is cleaved away, residual material of the adhesive layer 88 can be removed employing methods known in the art.

Figure 13:
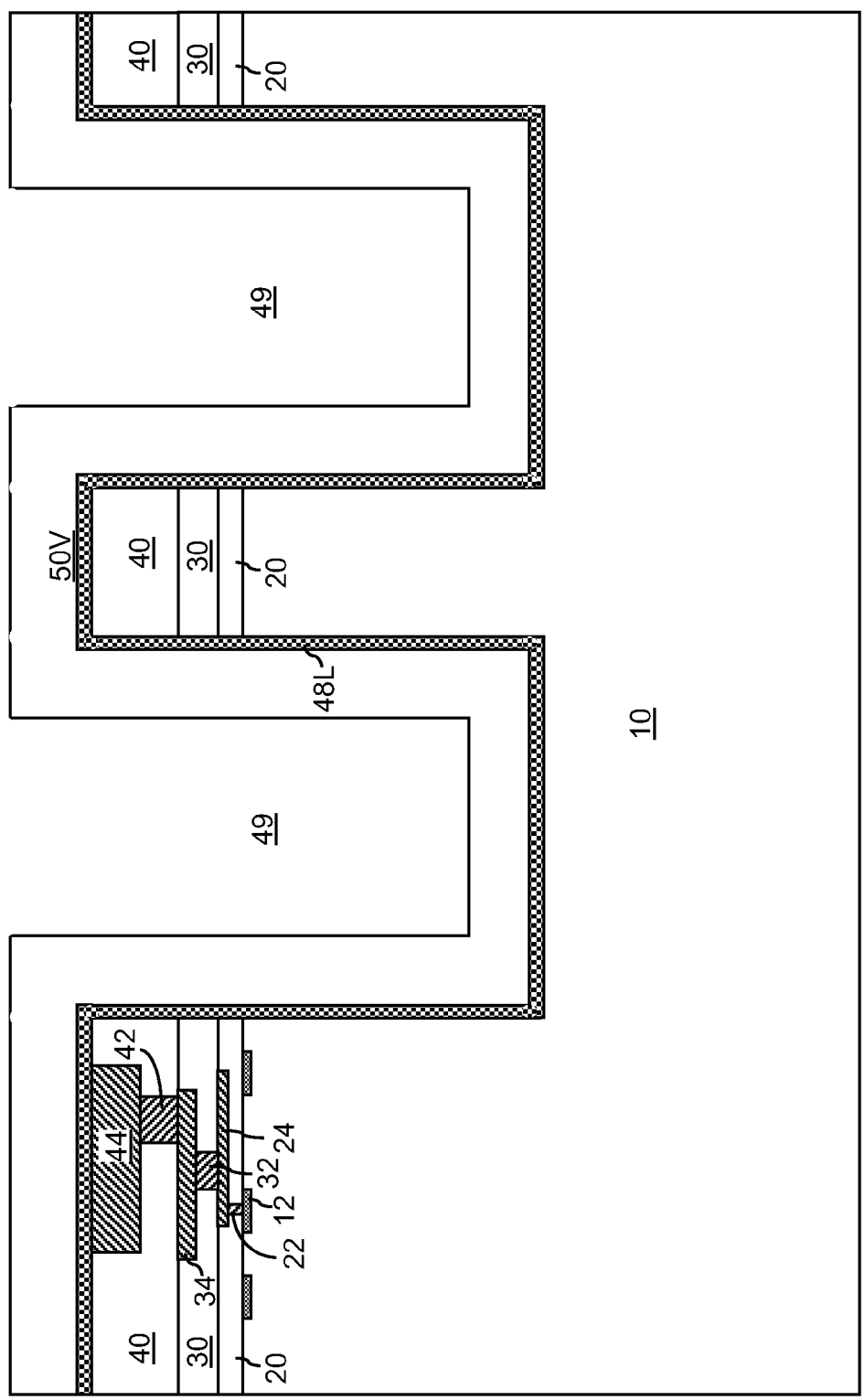
FIG. 13 is a vertical cross-sectional view of a second exemplary semiconductor structure after deposition of a dielectric liner according to a second embodiment of the present disclosure.

Referring to FIG. 13, a second exemplary semiconductor structure according to a second embodiment of the present disclosure can be derived from the first exemplary semiconductor structure of FIG. 3 by depositing a dielectric liner 50V without removing horizontal portions of the contiguous diffusion barrier layer 48L. In other words, the anisotropic etch that removes the horizontal portions of the contiguous diffusion barrier layer 48L is omitted in the second embodiment of the present disclosure. The dielectric liner 50V of the second embodiment can have the same thickness and composition, and can be formed employing the same methods, as in the first embodiment. Thus, the dielectric liner 50V is formed directly on an inner sidewall of the contiguous diffusion barrier layer 48L.

Figure 14:
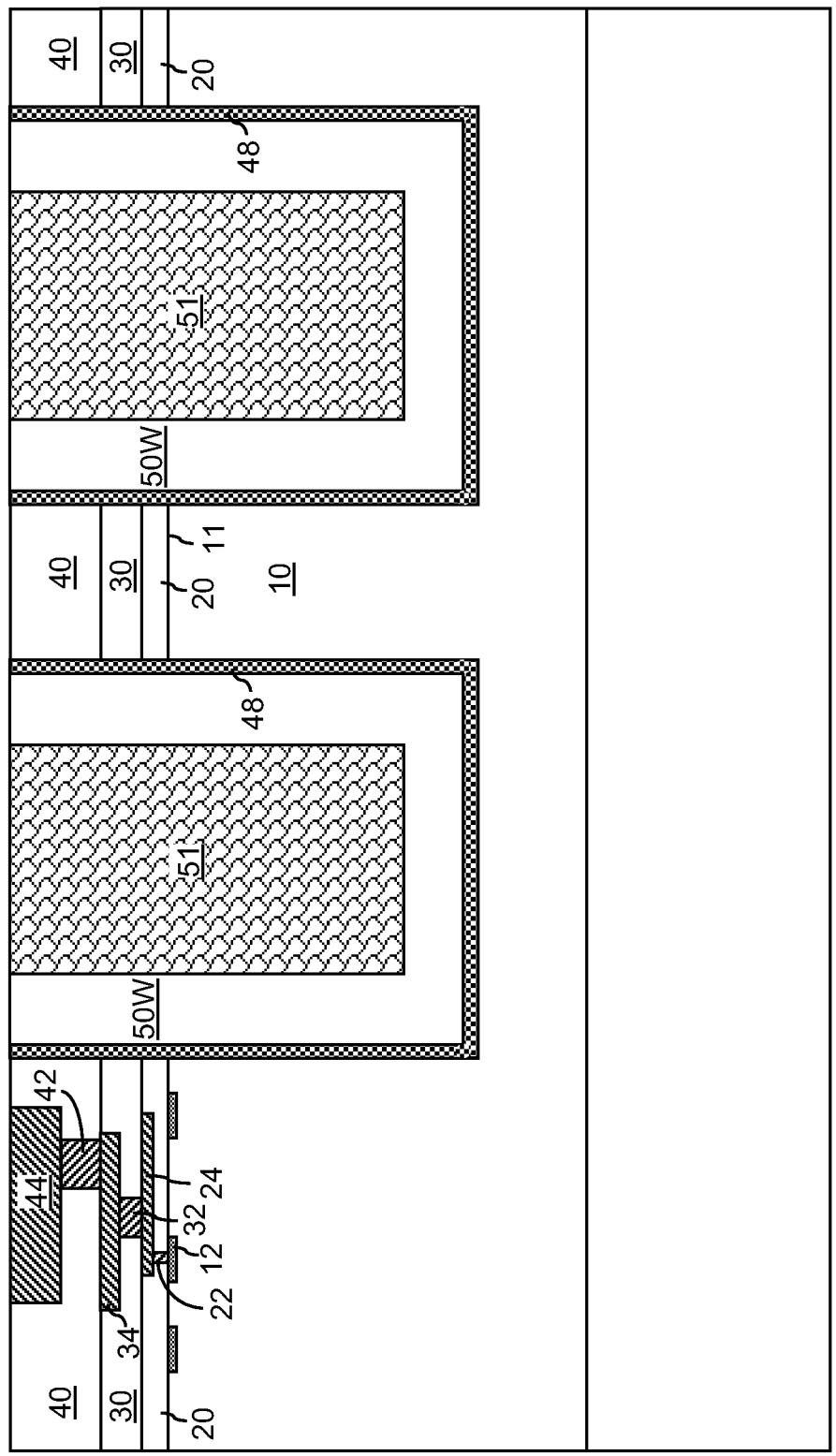
FIG. 14 is a vertical cross-sectional view of the second exemplary semiconductor structure after depositing a metallic conductive via structure and removal of the horizontal portions of the dielectric liner and the diffusion barrier liner according to the second embodiment of the present disclosure.

Referring to FIG. 14, a metallic conductive via structure 51 is formed in each of the at least one trench 49 by filling the at least one trench 49 with a conductive material. The conductive material can have the same composition, and can be deposited employing the same method, as in the first embodiment. The excess conductive material deposited over the topmost surface of the lower interconnect-level structures (20, 30, 40, 22, 24, 32, 34, 42, 44) is removed by a planarization process. The planarization process can employ chemical mechanical planarization, a recess etch, or a combination thereof. Materials that can be employed for the at least one metallic conductive via structure 51 include Cu, W, CoW, CoWP, Au, Al, and Ag. In addition, at least one metallic liner (not shown) can be optionally deposited between the dielectric liner 50V and the at least one metallic conductive via structure 51. Materials that can be employed for a metallic liner include TiN, TaN, WN, TiAlN, and TaCN.

During the planarization process, horizontal portions of the dielectric liner 50V is removed from above the topmost surface of the lower interconnect-level structures (20, 30, 40, 22, 24, 32, 34, 42, 44), which is located above the front surface 11. Further, horizontal portions of the contiguous diffusion barrier layer 48L are removed from above the topmost surface of the lower interconnect-level structures (20, 30, 40, 22, 24, 32, 34, 42, 44). Since horizontal portions of the contiguous diffusion barrier layer 48L are present only above the lower interconnect-level structures (20, 30, 40, 22, 24, 32, 34, 42, 44) and at the bottom of the filled trenches, all horizontal portions of the contiguous diffusion barrier layer 48L located above the front surface 11 are removed during the planarization step. Because the portions of the at least one conductive via structure 51 are also removed during the planarization step, the horizontal portions of the contiguous diffusion barrier layer 48L are removed after initial formation of the metallic conductive via structure 51 and concurrently with removal of upper end portion(s) of the at least one metallic conductive via structure 51.

The remaining portions of the contiguous diffusion barrier layer 48L after the planarization step is herein referred to as diffusion barrier liners 48. The remaining portions of the dielectric liner 50V that are embedded in the within the semiconductor substrate 10 and the lower interconnect-level structures (20, 30, 40, 22, 24, 32, 34, 42, 44) are herein referred to as embedded dielectric liners 50W, i.e., dielectric liners that are embedded. The topmost surfaces of the lower interconnect-level structures (20, 30, 40, 22, 24, 32, 34, 42, 44), the diffusion barrier liners 48, the embedded dielectric liners 50W, and the at least one metallic conductive via structure 51 are substantially planar among one another.

Figure 15:
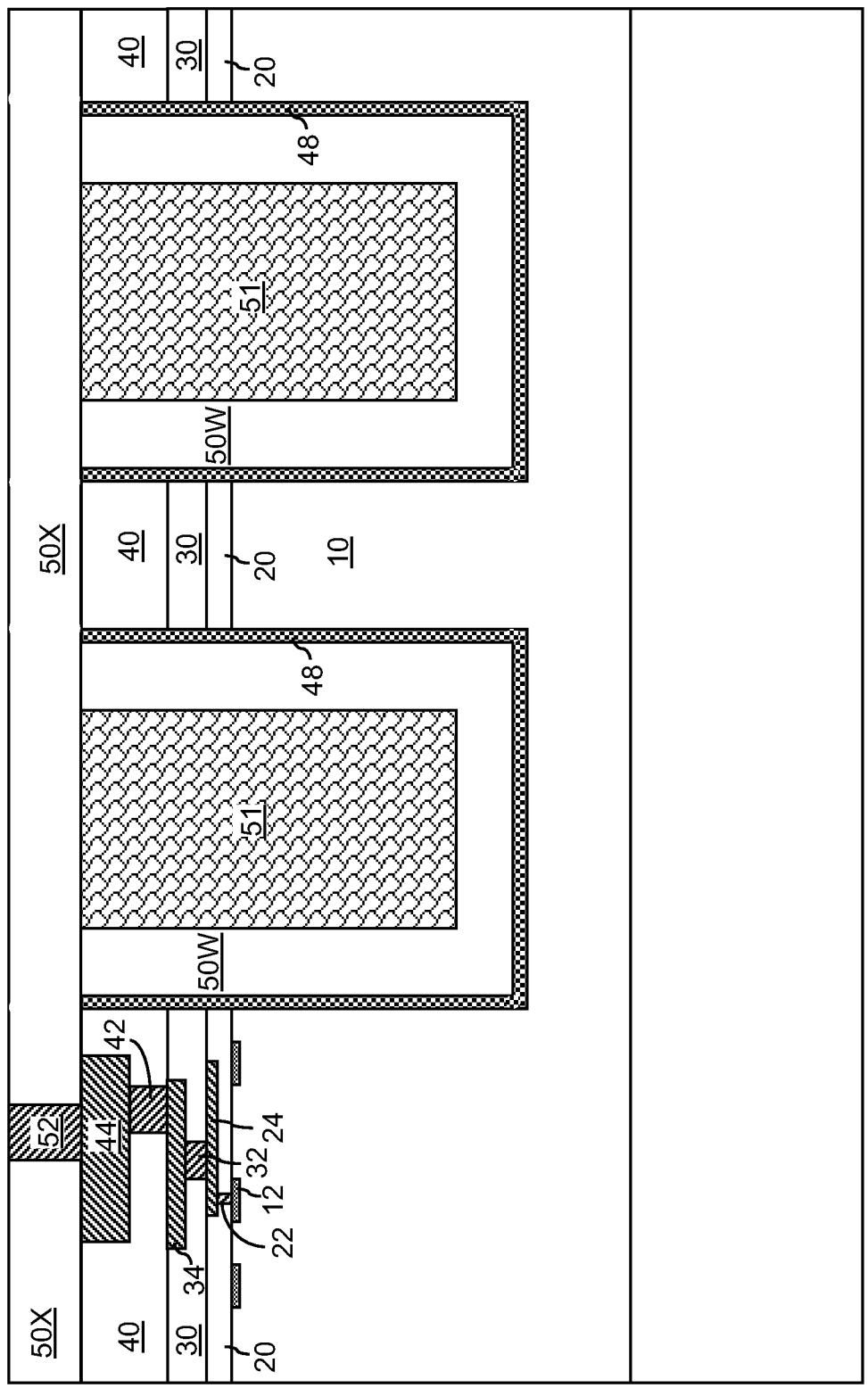
FIG. 15 is a vertical cross-sectional view of the second exemplary semiconductor structure after depositing a first upper back-end-of-line (BEOL) dielectric layer and formation of via structures therein according to the second embodiment of the present disclosure.

Referring to FIG. 15, a planar interconnect-level dielectric layer 50X can be deposited on the planar topmost surfaces of the lower interconnect-level structures (20, 30, 40, 22, 24, 32, 34, 42, 44), the diffusion barrier liners 48, the embedded dielectric liners 50W, and the at least one metallic conductive via structure 51. The planar interconnect-level dielectric layer 50X can include any dielectric material that can be employed for any of the upper interconnect-level dielectric layers (50L, 60, 70) of the first embodiment. At least one dielectric-liner-level metal interconnect structure 52 can be formed in the planar interconnect-level dielectric layer 50X employing methods known in the art. The planar interconnect-level dielectric layer 50X is an interconnect-level dielectric layer having a coplanar horizontal surface that contacts the at least one metallic conductive via structure 51 and the diffusion barrier liners 48.

Figure 16:
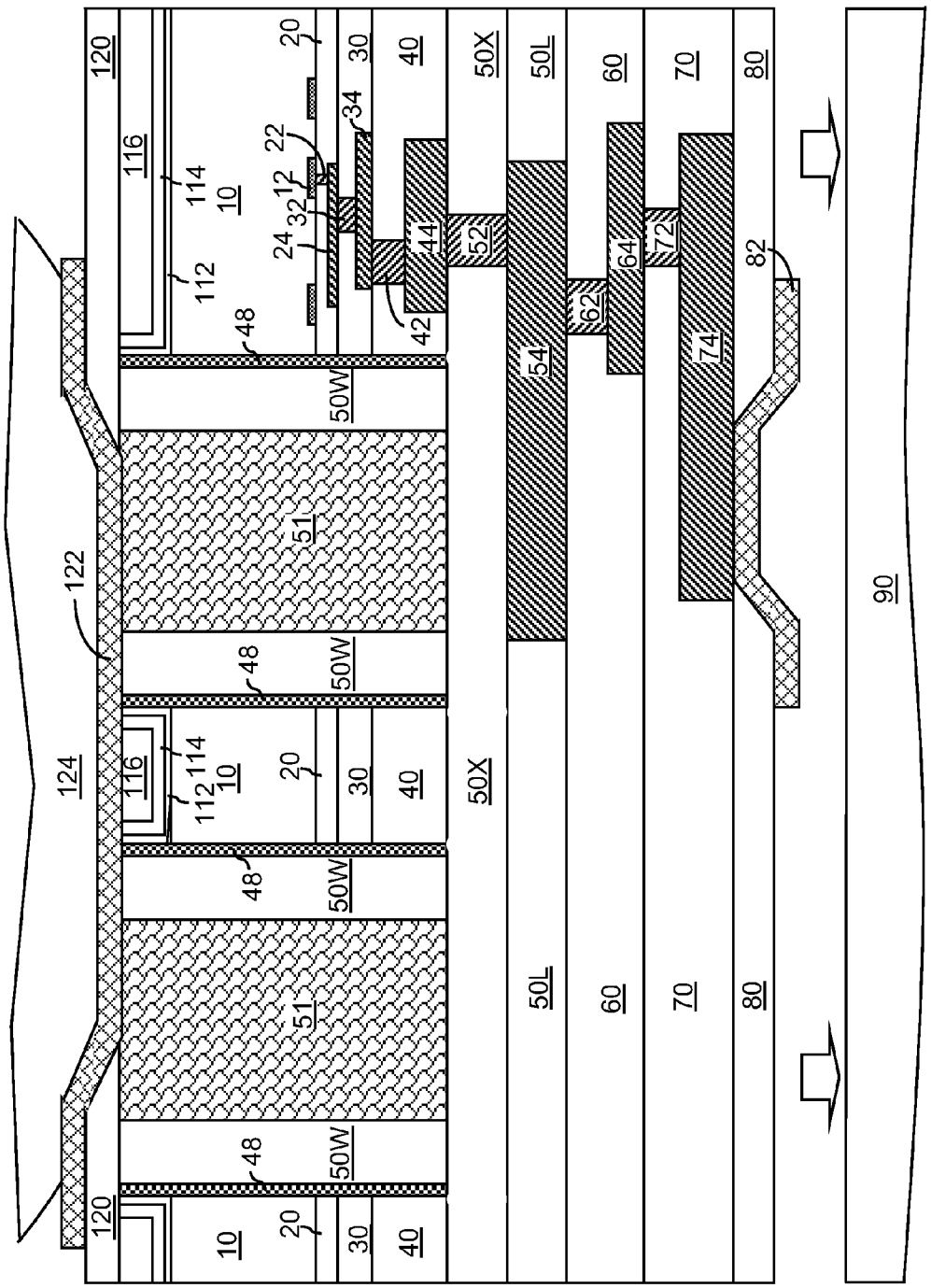
FIG. 16 is a vertical cross-sectional view of the second exemplary semiconductor structure after forming backside metal pads, attaching C4 balls on the backside, and separating the handle substrate from the front side according to the second embodiment of the present disclosure.

Referring to FIG. 16, the processing steps of FIGS. 6-12 can be performed on the second exemplary semiconductor structure. The presence of the diffusion barrier liners 48 ensures that metallic particles smeared onto exposed surfaces of the dielectric liner 50W are stopped at the interfaces between the diffusion barrier liners 48 and the remaining portions of the dielectric liner 50W during the process steps of FIG. 11, i.e., during the removal of the portions of the backside dielectric layers (112, 114, 116) above the at least one metallic conductive via structure 51 and upper portions of the at least one metallic conductive via structure 51 in the planarization step. Further, the presence of a dielectric material layer that functions as a diffusion barrier for metallic materials among the at least one of the backside dielectric layers (112, 114, 116) prevents metallic particles that are smeared onto the exposed surfaces of the backside dielectric layers (112, 114, 116) from entering the semiconductor substrate 10 through the back side surface 19 during this planarization step. Thus, the second exemplary semiconductor structure is immune to backside contamination of metals or reduces the risk of backside metal contamination significantly.

While the present disclosure has been particularly shown and described with respect to preferred embodiments thereof, it will be understood by those skilled in the art that the foregoing and other changes in forms and details can be made without departing from the spirit and scope of the present disclosure. It is therefore intended that the present disclosure not be limited to the exact forms and details described and illustrated, but fall within the scope of the appended claims.

What is claimed is:

1. A method of forming a semiconductor structure comprising:
    forming at least one semiconductor device on a first surface of a semiconductor substrate;
    forming a trench in said semiconductor substrate, wherein a semiconductor material of said semiconductor substrate is exposed at a sidewall and a bottom surface of said trench;
    forming a diffusion barrier liner directly on said sidewall;

forming a dielectric liner directly on an inner sidewall of said diffusion barrier liner and said semiconductor material at said bottom surface of said trench;
forming a metallic conductive via structure by filling said trench with a conductive fill material; and
thinning said semiconductor substrate, wherein said metallic conductive via structure extends at least from said first surface to a second surface of said semiconductor substrate after said thinning, wherein said second surface is located on an opposite side of said first surface.

2. The method of claim 1, wherein said diffusion barrier liner is formed by depositing a contiguous diffusion barrier layer and subsequently removing horizontal portions of said contiguous diffusion barrier layer are simultaneously removed from above said first surface and from within said trench, wherein said diffusion barrier liner includes remaining vertical portions of said contiguous diffusion barrier layer.

3. The method of claim 2, wherein said horizontal portions of said contiguous diffusion barrier layer are removed by an anisotropic etch, and a bottom surface of said trench is exposed after said anisotropic etch.

4. The method of claim 2, wherein said horizontal portions of said contiguous diffusion barrier layer are removed after formation of said metallic conductive via structure concurrently with removal of an end portion of said metallic conductive via structure.

5. The method of claim 1, further comprising:
forming a metal pad on said second surface, wherein said metal pad is conductively connected to said metallic conductive via structure; and
bonding a C4 ball to said metal pad.

6. The method of claim 1, further comprising forming a diffusion barrier layer directly on said second surface of said semiconductor substrate, wherein said diffusion barrier layer comprises a material that blocks diffusion of a metallic material.

7. The method of claim 1, wherein said diffusion barrier liner comprises a dielectric material that blocks diffusion of a metallic material.

8. The method of claim 7, wherein said diffusion barrier liner includes a metal-oxide-containing dielectric material.

9. The method of claim 7, wherein said diffusion barrier liner comprises a material selected from silicon carbide and $SiN_xC_yH_z$, wherein each value of x, y, and z is independently from 0 to about 1.

10. The method of claim 7, wherein said diffusion barrier liner comprises silicon nitride.

11. The method of claim 1, further comprising:
forming at least one semiconductor device on a first surface of said semiconductor substrate; and
forming a diffusion barrier layer on a second surface of said semiconductor substrate, wherein said second surface located on an opposite side of said first surface.

12. A method of forming a semiconductor structure comprising:
forming at least one semiconductor device on a first surface of a semiconductor substrate;
forming a trench in said semiconductor substrate, wherein a semiconductor material of said semiconductor substrate is exposed at a sidewall of said trench;
forming a diffusion barrier liner directly on said sidewall;
forming a dielectric liner;
forming a metallic conductive via structure by filling said trench with a conductive fill material; and
thinning said semiconductor substrate, wherein said metallic conductive via structure extends at least from said first surface to a second surface of said semiconductor substrate after said thinning, wherein said second surface is located on an opposite side of said first surface, wherein said dielectric liner is formed directly on an inner sidewall of said diffusion barrier liner, and said conductive fill material is formed directly on said dielectric liner.

13. The method of claim 12, wherein said diffusion barrier liner is formed by:
depositing a contiguous diffusion barrier layer within said trench and over said at least one semiconductor device; and
anisotropically etching said contiguous diffusion barrier layer, wherein remaining vertical portions constitute said diffusion barrier liner including an opening at a bottom portion thereof.

14. A method of forming a semiconductor structure comprising:
forming at least one semiconductor device on a first surface of a semiconductor substrate;
forming a trench in said semiconductor substrate, wherein a semiconductor material of said semiconductor substrate is exposed at a sidewall of said trench;
forming a diffusion barrier liner directly on said sidewall, wherein a conductive material in said diffusion barrier liner contacts said semiconductor material of said semiconductor substrate;
forming a metallic conductive via structure by filling said trench with a conductive fill material; and
thinning said semiconductor substrate, wherein said metallic conductive via structure extends at least from said first surface to a second surface of said semiconductor substrate after said thinning, wherein said second surface is located on an opposite side of said first surface.

15. The method of claim 14, wherein said diffusion barrier liner includes a conductive metallic nitride.

16. The method of claim 15, wherein said conductive metallic nitride is selected from TiN, TaN, WN, TiAlN, and TaCN.

17. The method of claim 14, wherein said diffusion barrier liner comprises an elemental metal.

18. The method of claim 14, wherein said diffusion barrier liner comprises an electroplatable material selected from a CoW alloy and a CoWP alloy.

19. The method of claim 14, further comprising forming a dielectric liner directly on an inner sidewall of said diffusion barrier liner, wherein said metallic conductive via structure is formed directly on said dielectric liner.

20. The method of claim 14, wherein said diffusion barrier liner is formed by:
depositing a contiguous diffusion barrier layer within said trench and over said at least one semiconductor device; and
anisotropically etching said contiguous diffusion barrier layer, wherein remaining vertical portions constitute said diffusion barrier liner including an opening at a bottom portion thereof.

* * * * *